March 26, 1963 D. C. WELLS 3,083,259

VIBRATION DAMPENING PRINTED CIRCUIT

Filed July 18, 1960

INVENTOR.

DOYLE C. WELLS

BY Knox & Knox

United States Patent Office 3,083,259

Patented Mar. 26, 1963

3,083,259

VIBRATION DAMPENING PRINTED CIRCUIT BOARD

Doyle C. Wells, San Diego, Calif., assignor to The Ryan Aeronautical Co., San Diego, Calif.

Filed July 18, 1960, Ser. No. 43,360

2 Claims. (Cl. 174—68.5)

Figure 1:
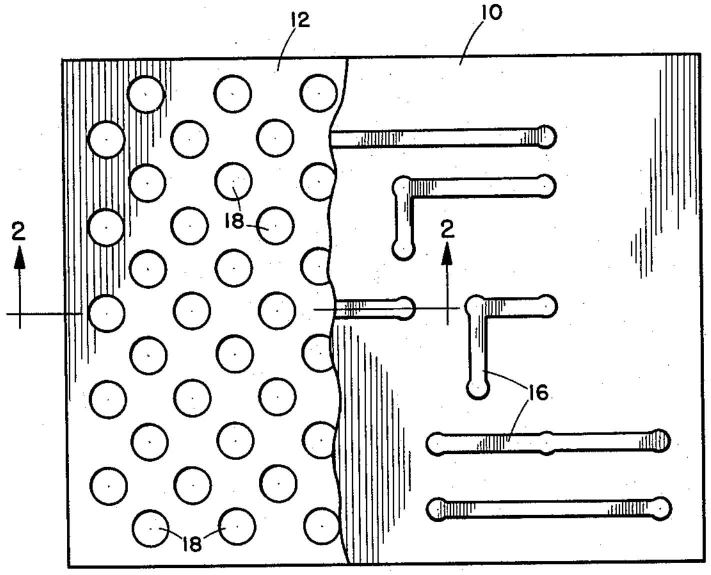

The present invention relates generally to electrical components and more particularly to a vibration dampening insulation board.

The primary object of this invention is to provide an insulation board, which is capable of dampening vibrations, particularly for printed circuit use in electronic equipment, having a layer of elastic material sandwiched between outer insulating panels on which the circuit is carried, the entire board being substantially non-conductive.

Another object of this invention is to provide an insulation board in which the central layer of elastic material is perforated to increase the dampening effect.

A further object of this invention is to provide a vibration absorbing insulation board which can be made only slightly thicker than conventional printed circuit boards and is adaptable to existing fixtures and connections.

Finally, it is an object to provide an insulating board of the aforementioned character which is simple and convenient to manufacture and which will give generally efficient and durable service.

Figure 2:
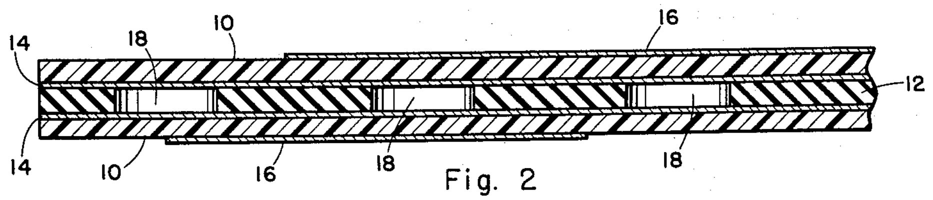

With these and other objects definitely in view, this invention consists in the novel construction, combination and arrangement of elements and portions, as will be hereinafter fully described in the specification, particularly pointed out in the claims, and illustrated in the drawing which forms a material part of this disclosure, and in which:

FIGURE 1 is an elevation view of one face of the insulation board, one outer panel being partially cut away; and FIGURE 2 is an enlarged fragmentary sectional view taken on the line 2—2 of FIGURE 1.

Similar characters of reference indicate similar or identical elements and portions throughout the specification and throughout the views of the drawing.

The insulation board is a sandwich type structure comprising a pair of substantially rigid outer panels 10 and an elastic dampening layer 12, bonded to the outer panels by a suitable adhesive indicated at 14. The outer panels 10 are made from the material commonly used for conventional printed circuit boards, such as a paper, cloth or glass fiber base impregnated with plastic or resin to make a stiff, plate-like panel which is electrically non-conductive. One or both of the outer panels 10 may have electronic circuitry applied thereon, typical printed circuit portions being indicated at 16, the various methods of application being well known and not considered as a part of the present disclosure. In addition, many different electronic components may be mounted on the board for direct coupling into the circuit.

The dampening layer 12 is of elastic material, such as polyvinylchloride, rubber or synthetic rubber, or some similar electrically insulative material having the necessary elasticity and of a thickness comparable to the thickness of the outer panels. Since the composition of the outer panels and dampening layer may vary considerably, the type of adhesive 14 is selected to suit particular requirements. With certain materials direct bonding may be practical, the specific method of assembly not being critical, other than a total surface to surface bond over the full contact area of the sandwich layers.

In the usual printed circuit assemblies, the individual boards with circuitry and components attached are normally secured at one end in connecting means, or may be attached to mounting structure at both ends. The insulation board, with components mounted thereon, constitutes a spring mass system which is resonant at its fundamental frequency, the board having a certain amount of natural resiliency. In the presence of much electronic apparatus and when subject to vibrations of different characteristics, the insulation board may resonate, setting up vibration in the electronic components. In extreme conditions, this vibration can damage components and circuitry causing failure. When subjected to sources of vibration corresponding to its fundamental resonant frequency, the insulation board spring mass system will vibrate at such an amplitude that the energy lost due to dampening may equal the input energy to the system.

By incorporating a layer 12 of elastic material into the insulating board, vibration is quickly damped and no resonant vibration of significant magnitude can be built up. Dampening characteristics can be increased by providing the dampening layer 12 with spaced perforations 18, which increase the normally low shear stress of the elastic material, the greater the number of perforations, the higher the dampening effect.

Due to the sandwich type structure, the outer panels 10 may be made considerably thinner than conventional printed circuit boards, so that the total thickness is very little, if any, greater than normal. Weight increase is negligible over that of conventional boards, an important factor in the assembly of electronic equipment for aircraft. The weight is decreased to an appreciable extent by the perforations 18, while increasing the dampening characteristics, a double advantage. Circuits utilizing the vibration dampened boards have increased reliability and require a minimum of servicing. While the board is primarily intended for printed circuit use, the structure may be applicable to other situations requiring a combination of vibration dampening and electrical insulation.

The operation of this invention will be clearly comprehended from a consideration of the foregoing description of the mechanical details thereof, taken in connection with the drawing and the above recited objects. It will be obvious that all said objects are amply achieved by this invention.

It is understood that minor variation from the form of the invention disclosed herein may be made without departure from the spirit and scope of the invention, and that the specification and drawing are to be considered as merely illustrative rather than limiting.

I claim:

1. An insulation board, comprising: a pair of thin, substantially stiff imperforate outer panels of electrically non-conductive material; and an inner layer of electrically non-conductive, elastic rubber-like material having adhesive on both faces thereof whereby said layer is bonded between said outer panels; said inner layer having a plurality of unlined perforations therein, to increase the dampening effect.

2. An insulation board, comprising: a pair of thin, substantially stiff imperforate, outer panels of electrically non-conductive material; a printed circuit on the external surface of at least one of said outer panels; and an inner layer of electrically non-conductive, elastic, vibration dampening material having adhesive on both faces thereof whereby said layer is bonded between said outer panels; said inner layer having a plurality of perforations spaced throughout said inner layer, to increase the dampening effect and being of a thickness comparable to the thickness of said outer panels.

References Cited in the file of this patent

UNITED STATES PATENTS

| | | |
|---|---|---|
| 1,973,124 | Swan et al. | Sept. 11, 1934 |
| 2,237,623 | Ledwinka | Apr. 8, 1941 |
| 2,958,064 | Swengel | Oct. 25, 1960 |
| 3,007,997 | Panariti | Nov. 7, 1961 |